United States Patent [19]

Villa

[11] 4,364,029
[45] Dec. 14, 1982

[54] FAST TRANSIENT DIGITIZER

[75] Inventor: Francesco Villa, Palo Alto, Calif.

[73] Assignee: The United States of America as represented by the Department of Energy, Washington, D.C.

[21] Appl. No.: 281,453

[22] Filed: Jul. 8, 1981

[51] Int. Cl.³ .................................... H03K 13/02
[52] U.S. Cl. .................... 340/347 SH; 340/347 AD; 324/102; 315/8.5
[58] Field of Search ....... 340/347 AD, 347 M, 347 P, 340/347 SH; 315/8.5; 313/366, 367, 368; 324/102

[56] References Cited

U.S. PATENT DOCUMENTS 3,059,228 10/1962 Beck .............................. 340/347 SH
3,333,146 7/1967 Dill ..................................... 315/8.5
4,112,425 9/1978 Zobrist ......................... 340/347 AD

OTHER PUBLICATIONS

EG&G Research and Development FY 1979 Final Report, Doe Contract No. DE-AC08-76NV01181 No. EGG-1183-1757, Dec. 1979, pp. 58-63.
Abstract 14151 Energy Research Abstracts, vol. 5, No. 9, May 15, 1980, p. 1536.

Primary Examiner—C. D. Miller
Attorney, Agent, or Firm—Clifton E. Clouse, Jr.; Roger S. Gaither; Richard G. Besha

[57] ABSTRACT

Method and apparatus for sequentially scanning a plurality of target elements with an electron scanning beam modulated in accordance with variations in a high-frequency analog signal to provide discrete analog signal samples representative of successive portions of the analog signal; coupling the discrete analog signal samples from each of the target elements to a different one of a plurality of high speed storage devices; converting the discrete analog signal samples to equivalent digital signals; and storing the digital signals in a digital memory unit for subsequent measurement or display.

11 Claims, 6 Drawing Figures

FAST TRANSIENT DIGITIZER

The United States Government has rights in this invention pursuant to Contract No. DE-AC03-76SF00515 (formerly No. E(04-3)-515) between the U.S. Department of Energy and Stanford University.

BACKGROUND OF THE INVENTION

This invention relates to signal processing and measurement systems of the type used to display or measure analog variable amplitude signals of interest.

Devices are known which are capable of measuring or displaying variable amplitude analog electrical signals. Perhaps the most commonly used instrument of this type is the conventional oscilloscope having a CRT display on which wave forms can be visually displayed and measured by an operator. Known instruments of this type have a lower resolution of about two nanoseconds temporally and the decibel equivalent of seven bits dynamically. Thus, extremely high-frequency analog electrical signals having a wider dynamic range than seven bits cannot be effectively displayed on known devices with any degree of accuracy. In addition, known devices of this type can only display a limited length of a high frequency variable amplitude electrical signal, so that only a small portion thereof is visibly displayed at any given time.

SUMMARY OF THE INVENTION

The invention comprises a method and apparatus for processing high frequency variable amplitude analog electrical signals which affords a temporal resolution down to approximately one nanosecond over a dynamic range of nine bits (55 DB) with little limitation of the length of the analog signal.

The method comprises the steps of sequentially scanning a plurality of target elements with an electron scanning beam modulated in accordance with variations in a high-frequency analog signal to provide discrete analog signal samples representative of successive portions of the analog signal; coupling the discrete analog signal samples from each of the target elements to a different one of a plurality of high speed storage devices; converting the discrete analog signal samples to equivalent digital signals; and storing the digital signals in a digital memory unit for subsequent measurement or display.

The system comprises means for generating a plurality of discrete analog signal samples corresponding to successive portions of a high frequency analog electrical signal, the generating means including means for generating an electron scanning beam, a control element having a terminal adapted to be coupled to the analog electrical signal for modulating the intensity of the scanning beam in accordance with amplitude variations of the analog signals, and a plurality of target elements sequentially arranged along the scanning path of the beam for receiving successive intensity modulated portions of the scanning beam; a plurality of high-speed analog storage devices coupled to different ones of the plurality of target elements for storing discrete analog signal samples received by associated target elements during successive scans; means coupled to the analog storage devices for converting the discrete analog signal samples to equivalent digital signal samples; and means coupled to the converting means for storing the digital signal samples. The target elements are distributed preferably on a circular scanning path and comprise one of two types: a first type comprising a conductive electrode for receiving a quantity of electrical charge proportional to the amplitude of the sampled high frequency analog signal during scanning thereof; and a second type comprising a semiconductive element for generating an amplified signal representative of the amplitude of the sampled high-frequency analog signal during scanning thereof. The latter type of target element preferably comprise a spaced pair of semi-conductive elements having a plurality of interleaved conducting electrodes. The high-speed analog storage devices preferably comprise arrays of charge coupled devices.

For a fuller understanding of the nature and advantages of the invention, reference should be had to the ensuing detailed description taken in conjunction with the accompanying drawings.

DESCRIPTION OF THE PREFERRED EMBODIMENTS

Figure 1:
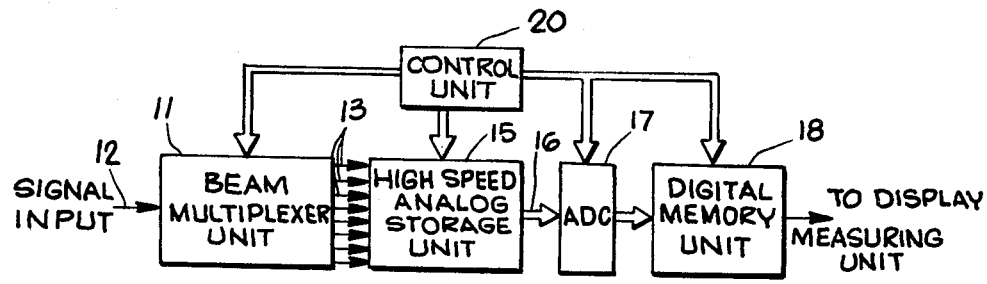
FIG. 1 is a block diagram of the invention.

Turning now to the drawings, FIG. 1 illustrates a block diagram of the invention. As seen in this Fig., a beam multiplexer unit 11 has an input terminal 12 to which a highfrequency signal may be applied for purposes of processing. The output of beam multiplexer unit 11 comprises a plurality of conductors 13 which are coupled to a high-speed analog storage unit 15. The output 16 of high-speed analog storage unit 15 is coupled to an analog to digital converter 17 capable of converting analog input signals to equivalent multibit digital signals. The output of analog to digital converter 17 is coupled to a digital memory unit 18 capable of storing a relatively large number of multibit digital signals. Elements 11, 15, 17 and 18 are coupled to a control unit 20 which provides appropriate timing signals for the operation of these elements. The output of digital memory unit 18 may be coupled to a follow-on display or measuring unit, as desired.

In operation, high-frequency analog input signals present on terminal 12 are converted to discrete analog signal sample by beam multiplexer unit 11 at a relatively high rate and the samples are temporarily stored in high speed analog storage unit 15. The capacity of high-speed analog storage 15 is preferably sufficiently large to store the entire length of the high-frequency analog input signal present at input terminal 12. After the complete signal has been so stored in unit 15, the successive discrete analog samples are read out at a slower rate under direction of control unit 20, are converted from analog-to-digital form by converter 17, and are stored in digital memory unit 18. Thereafter, the digital signals stored in memory unit 18 may be read out under direction of control unit 20 to a suitable display unit, such as a high-speed oscilloscope, at a rate compatible with the response time of the display unit in order to provide an analog signal display with final resolution. If desired, the digital signals stored in memory unit 18 may be coupled to a measuring unit, such as a chart recorder, for permanent recording. As will be apparent to those skilled in the art, the digital output characters from memory unit 18 may require additional processing before coupling to an oscilloscope or a chart recorder, e.g. digital-to-analog reconversion, level change, amplification or the like. Since such processing involves conventional techniques and equipment, further description thereof will be omitted to avoid prolixity.

Figure 2:
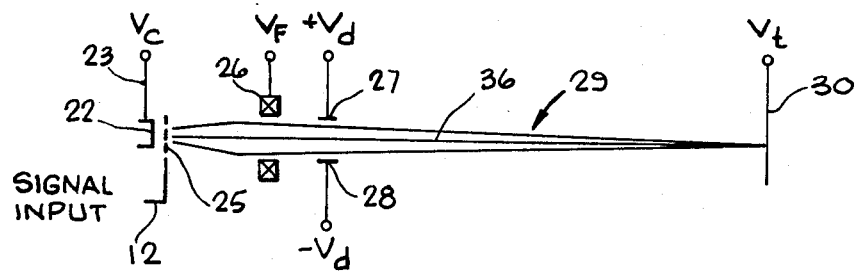
FIG. 2 is a schematic diagram showing the beam multiplexer unit elements.

Beam multiplexer unit 11 includes the elements depicted schematically in FIG. 2 for processing the high-frequency analog input signals. As seen in FIG. 2, unit 11 includes an emissive cathode 22 to which a suitable potential $V_c$ is applied at terminal 23 for generating an electron beam in a known manner. Unit 11 further includes a control grid 25 to which the high frequency input signal is applied for modulating the electron beam. Also included is a focusing element 26 to which a focusing voltage $V_f$ is applied for controlling the diameter of the modulated electron beam, and deflection electrodes 27, 28 to which appropriate deflection voltages $+V_d$ and $-V_d$ are applied for controlling the position of the modulated beam 29 with respect to a target plane 30, to which an acceleration potential $V_t$ is applied. The above elements are all enclosed in an evacuated enclosure (not shown) in a conventional manner.

In operation, the application of suitable control voltages to cathode 23, focusing element 26, deflection elements 27, 28 and target plane 30 results in the generation of a scanning beam of electrons which is intensity modulated in accordance with the amplitude of the input signal on control grid 25. As will be apparent to those skilled in the art, this portion of beam multiplexer unit 11 resembles commercially available high-voltage high-frequency vacuum triodes; accordingly, selection of proper control voltages is deemed to be well within the skill of the ordinary routineer in the art.

Figure 3:
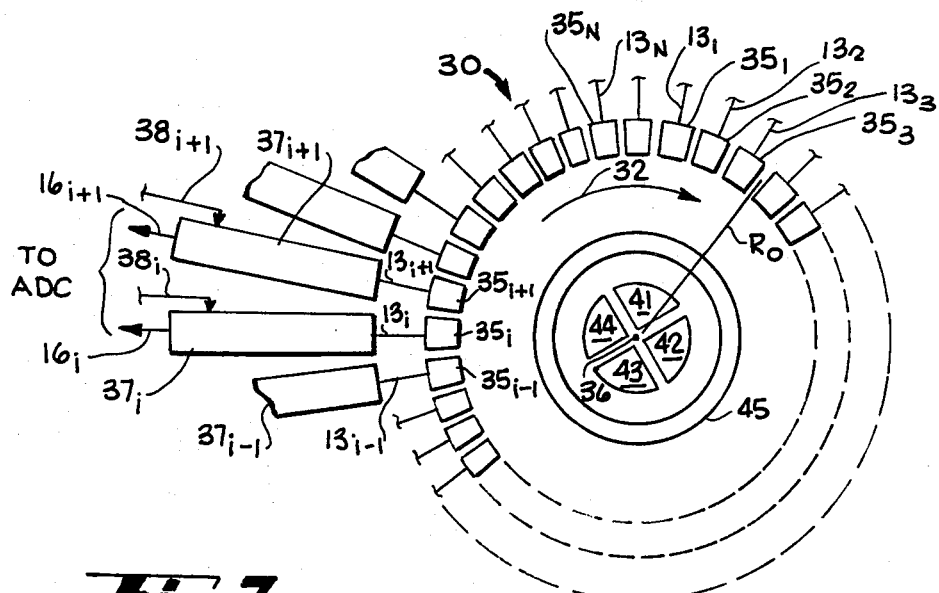
FIG. 3 is a schematic diagram showing a first embodiment of the invention.

FIG. 3 illustrates a first embodiment of a novel target plane 30 and a portion of the high-speed analog storage unit 15 constructed according to the teachings of the invention. In this fig., the modulated scanning beam direction is into the page, and the beam is scanned in a circular path represented by arrow 32. Target plane 30 includes a plurality of electrically conductive target elements $35_i$ arranged in a circular path of predetermined mean radius Ro measured from the central beam axis 36. Each target element $35_i$ is separated by a predetermined distance from adjacent target elements in order to be electrically isolated therefrom. Centrally disposed on target plane 30 are conventional auxiliary quadrant targets 41–44 and circular sensing target element 45 which are provided to enable centering of beam 29 along the geometrical axis of the beam multiplexer unit 11 in a conventional manner.

Each target element $35_i$ is provided with an electrically conductive terminal $13_i$ which is directly coupled to the input of an associated high-speed analog storage device $37_i$ located exteriorly of the enclosure housing target plane 30 and the elements depicted in FIG. 3 of beam multiplexer unit 11. Each high-speed analog storage device $37_i$ commprises an array of elemental units capable of storing an analog signal sample during the brief period of time that beam 29 sweeps across the corresponding target element $35_i$, which period is typically on the order of one nanosecond. One such commercially available device is a Fairchild type CCD 311 charge coupled device having a dynamic range of $55_{db}$, corresponding to a digital resolution of nine bits, containing two parallel chains of 455 bits each. Another such device is a Fairchild type CCD 311 charge coupled device having two parallel chains of 130 bits each. Other suitable devices will occur to those skilled in the art. Each high-speed analog storage device $37_i$ includes several clock input terminals generally designated by a bus $38_i$ to which appropriate clocking signals are supplied from control unit 20 to clock successive samples therealong, and also to control application of the output signals therefrom to analog-to-digital converter 17 at a predetermined slower clock rate determined by the minimum access time of digital memory unit 18.

In operation, as beam 29 is scanned along the circular path of radius Ro, successive target elements $35_1, 35_2 \ldots 35_i \ldots 35_n$ are traversed thereby. As beam 29 traverses each target element $35_i$, a quantity of charge is stored thereon which is proportional to the amplitude of the corresponding portion of the analog input signal coupled to input 12 of beam multiplexer unit 11. The charge received by target element $35_i$ is coupled to the input of the associated high-speed analog storage device $37_i$ via conductive lead $13_i$ and stored in the input stage thereof. After the traverse by beam 29 of a given target element $35_i$ is completed, clock pulses are supplied from control unit 20 to clock input terminals $38_i$ which causes the charge stored in each stage of high speed analog storage device $37_i$ to be transferred to the next succeeding stage. This process is repeated for each sweep by beam 29 of the remaining target elements $35_i$ in a serial fashion. After each high-speed analog storage device $37_i$ has been completely loaded with the maximum number of samples, scanning of beam 29 is terminated and the output of each device $37_i$ is transferred to analog-to-digital converter 17 in which the samples are converted to multibit digital characters, and thence into digital memory unit 18 for storage. Once stored in digital form, the information contained in the digital characters may be used in any desired manner, e.g. for display or recording purposes.

As well be appreciated by those skilled in the art, the resolution of the embodiment of FIG. 3 is primarily dependent upon the time required to saturate the input stage of each high speed analog storage device $37_i$. For example, with a Fairchild type CCD 311 device, the saturation time is a function of both scanning time and beam current. Thus, if a scanning period of one nanosecond is selected (i.e. beam 29 is rotated at an angular speed such that a given target element $35_i$ is traversed in one nanosecond), a beam current of approximately 3 ma. is required to guarantee saturation of the input stage. If a shorter scanning period is required, the beam current must be correspondingly increased; conversely, if a longer scanning period is satisfactory, the beam current can be correspondingly decreased. In general, the higher the beam current required for complete saturation, the slower the response of beam multiplexer unit 11 and thus the poorer the temporal resolution. Since the invention is intended to facilitate processing of extremely fast analog input signals, it is generally desirable to maintain the beam current at a minimum value.

Figure 4:
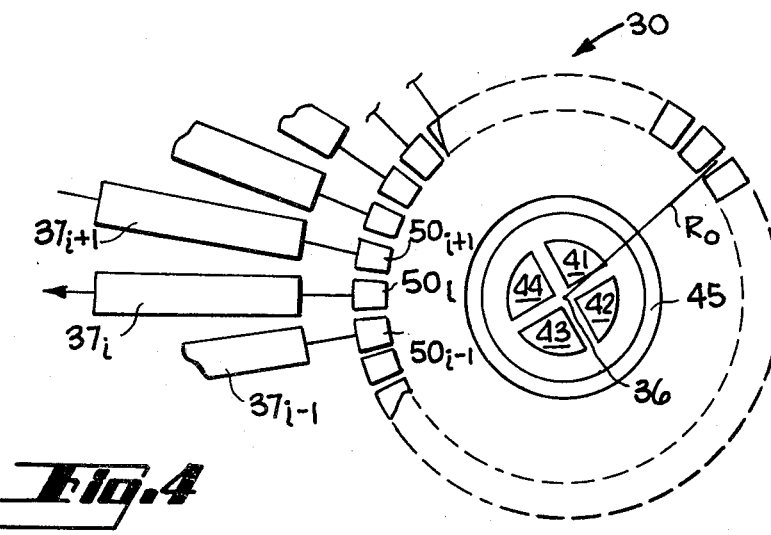
FIG. 4 is a schematic diagram illustrating an alternative embodiment of the invention.
Figure 5:
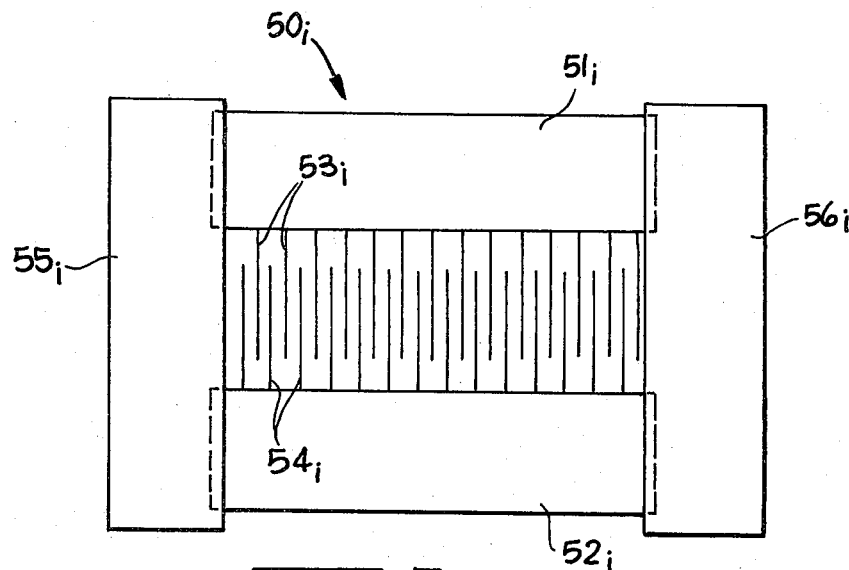
FIG. 5 is an enlarged view of a target element of the FIG. 4 embodiment.
Figure 6:
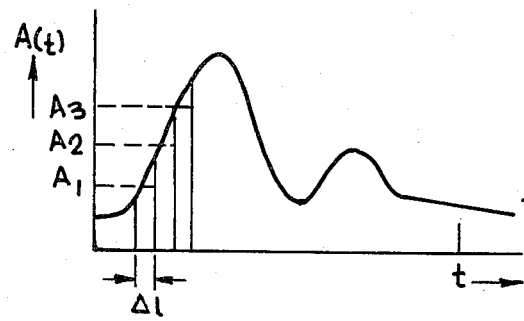
FIG. 6 is a waveform diagram illustrating use of the invention.

FIGS. 4 and 5 illustrate an alternate embodiment of the invention affording greater resolution and temporal speed. With reference to FIG. 4, the arrangement is similar to that shown in FIG. 3 in that a plurality of target elements $50_i$ are arranged in a circular pattern of mean radius $R_o$, with each target element $50_i$ coupled via an electrical conductor to an associated high-speed analog storage device $37_i$, and beam finder elements 41-45 are centrally located on target plane 30. With reference to FIG. 5, each target element $50_i$ comprises a pair of spaced semiconductive members $51_i$, $52_i$ each provided on the facing side with a plurality of interdigitated finger-like electrodes $53_i$, $54_i$, respectively. Each target element $50_i$ further includes a flanking pair of insulative pads $55_i$, $56_i$ which are electrically nonconductive and electro-magnetically opaque for the purpose of isolating each target element $50_i$ from the adjacent target elements $50_{i-1}$ and $50_{i+1}$.

In operation, as beam 29 sweeps across electrodes $53_i$, $54_i$, the conductivity of the semiconductive members $51_i$, $52_i$ varies proportionally with the beam intensity. Thus, with semiconductive member $52_i$ coupled to a low impedance voltage source $V_t$, the voltage appearing at the output of semiconductive member $51_i$ is proportional to the total beam intensity during traverse of electrodes $53_i$, $54_i$. Since the arrangement of FIG. 5 is essentially a semiconductive amplifier, the speed of this alternate embodiment is substantially greater than that of the embodiment of FIG. 3.

It should be noted that interdigitated electrodes $53_i$, $54_i$ eliminate variations in the output signal generated by a given target element $50_i$ due to any eccentricity in the cross-sectional shape of beam 29, and are thus preferred. In applications in which the cross-sectional shape of the beam is maintained essentially circular throughout the circular beam scanning path, the arrangement of the electrodes may be eliminated.

The embodiment of FIGS. 4 and 5 can be fabricated using conventional semiconductor processes which are well known in the art. For example, for a target plane 30 employing GaAs, high sensitivity chromium doped semiconductive members $51_i$, $52_i$, having a total dimension of $10 \times 20$ mils, a target plane 30 will have a diameter of 160 mils (assuming a separation distance of 5 mils between adjacent semiconductive members $51_i$, $52_i$). The radial deflection $R_o$ of beam 29 is 80 mils, which may be achieved with deflection voltages of around 200 volts DC. With an accelerating voltage $V_t$ of about 20 KV, the maximum beam current required is 0.25 ma.

Other semiconductive materials may be employed for members $51_i$, $52_i$, such as short lifetime silicon or PIN photo diodes (commercially available from United Detector Technology) having a diameter of 40 mils. Other equivalent materials and commercially available products will occur to those skilled in the art.

As will now be apparent, the invention provides a signal processing technique which enables accurate measurement of extremely high frequency analog signals having a wide dynamic range of amplitudes. Further, the invention provides extremely fine temporal resolution of the order of one nanosecond, hitherto unattainable with known devices. In addition, the invention enables the storage of an extremely long high-frequency analog signal for display and measurement purposes, due to the high speed storage capability of the analog storage devices $37_i$ and the ability to clock storage samples from each device $37_i$ at a slower rate compatible with the analog-to-digital converter 17 and digital memory unit 18.

While the above provides a full and complete disclosure of the preferred embodiments of the invention, various modifications, alternate constructions and equivalents may be employed without departing from the true spirit and scope of the invention. For example, other geometries than the circular geometry depicted may be employed, as desired. A linear scanning scheme, for example, may be employed with the invention, with appropriate clocking signals and deflection signals to provide beam retrace at appropriate speeds. Therefore the above description and illustrations should be not construed as limiting the scope of the invention which is defined by the appended claims.

What is claimed is:

1. A method of processing a high frequency analogy electrical signal for subsequent analysis, said method comprising the steps of:
   (a) sequentially scanning a plurality of target elements with an electromagnetic scanning beam modulated in accordance with variations in said high frequency analog signal to provide discrete analog signal samples representative of successive portions of said high voltage analog signal;
   (b) coupling said discrete analog signal samples from each of said target elements to a different one of a plurality of high speed storage devices;
   (c) converting said discrete analog signal samples to equivalent digital signals; and
   (d) storing said digital signals in a digital memory unit;
   wherein each of said plurality of target elements comprises a semiconductive element for generating an amplified signal representative of the amplitude of said high frequency analog signal during scanning thereof, and
   wherein each of said plurality of target elements comprises a spaced pair of semiconductive elements having a plurality of interleaved conducting electrodes.

2. The method of claim 1 wherein said target elements are arranged in a circular path and said step (a) of scanning includes the step of sweeping said modulated beam along said circular path.

3. The method of claim 1 wherein said plurality of target elements each comprises a conductive electrode and said step (a) of scanning includes the step of depositing on each electrode a quantity of electrical charge proportional to the amplitude of said high voltage analog signal during scanning thereof.

4. The method of claim 1 wherein each of said plurality of target elements comprises a semiconductive element and said step (a) of scanning includes the step of amplifying the high frequency analog signal portion incident upon each of said elements prior to said step (b) of coupling.

5. A system for processing a high frequency analog electrical signal for subsequent analysis, said system comprising:
   means for generating a plurality of discrete analog signal samples corresponding to said high frequency analog electrical signal, said generating means including means for generating a scanning beam of electromagnetic radiation, a control element having a terminal adapted to be coupled to said analog electrical signal for modulating the intensity of said scanning beam in accordance with amplitude variations of said analog signals, and a plurality of target elements sequentially arranged along a scanning path of said beam for receiving successive intensity modulated portions of said scanning beam;
   a plurality of high speed analog storage devices coupled to different ones of said plurality of target elements for storing discrete analog signal samples received by associated target elements during successive scans thereof;

means coupled to said analog storage devices for converting said discrete analog signal samples to equivalent digital signal samples; and means coupled to said converting means for storing said digital signal samples;

wherein each of said plurality of target elements comprises a semiconductive element for generating an amplified signal representative of the amplitude of said high frequency analog signal during scanning thereof; and wherein each of said plurality of target elements comprises a spaced pair of semiconductive elements having a plurality of interleaved conducting electrodes.

6. The combination of claim 5 wherein said target elements are distributed along a circular scanning path.

7. The combination of claim 6 wherein each of said plurality of target elements comprises a conductive electrode for receiving a quantity of electrical charge proportional to the amplitude of said high frequency analog signal during scanning thereof.

8. The combination of claim 5 wherein each of said plurality of high speed analog storage devices comprises an array of charged coupled devices.

9. A beam multiplexer for generating a plurality of discrete analog signal samples from a high frequency analog signal, said beam multiplexer comprising:

means for generating a scanning beam of electromagnetic radiation;

control means adapted to be coupled to said high frequency analog signal for modulating the intensity of said scanning beam; and a plurality of individual target elements arranged along a scanning path of said scanning beam for receiving successive intensity modulated portions of said scanning beam;

wherein each of said plurality of individual target elements comprises a semiconductive element for generating an amplified signal representative of the amplitude of said high frequency analog signal during scanning thereof; and wherein each of said target elements comprises a spaced pair of semiconductive elements having a plurality of interleaved conducting electrodes.

10. The combination of claim 9 wherein said target elements are distributed along a circular scanning path.

11. The combination of claim 9 wherein each of said plurality of target elements comprises a conductive electrode for receiving a quantity of electrical charge proportional to the amplitude of said high frequency analog signal during scanning thereof.

* * * * *